(12) United States Patent
Fink

(10) Patent No.: US 7,601,242 B2
(45) Date of Patent: Oct. 13, 2009

(54) PLASMA PROCESSING SYSTEM AND BAFFLE ASSEMBLY FOR USE IN PLASMA PROCESSING SYSTEM

(75) Inventor: Steven T. Fink, Mesa, AR (US)

(73) Assignee: Tokyo Electron Limited (JP)

( * ) Notice: Subject to any disclaimer, the term of this patent is extended or adjusted under 35 U.S.C. 154(b) by 625 days.

(21) Appl. No.: 11/032,101

(22) Filed: Jan. 11, 2005

(65) Prior Publication Data

US 2006/0151114 A1  Jul. 13, 2006

(51) Int. Cl.
*C23F 1/00* (2006.01)
*H01L 21/306* (2006.01)
*C23C 16/00* (2006.01)

(52) U.S. Cl. .................... 156/345.51; 118/715

(58) Field of Classification Search ............. 156/345.51
See application file for complete search history.

(56) References Cited

U.S. PATENT DOCUMENTS

| | | |
|---|---|---|
| 4,209,357 A | 6/1980 | Gorin et al. |
| 4,263,088 A | 4/1981 | Gorin |
| 4,270,999 A | 6/1981 | Hassan et al. |
| 4,297,162 A | 10/1981 | Mundt et al. |
| 4,310,390 A | 1/1982 | Bradley et al. |
| 4,352,974 A | 10/1982 | Mizutani et al. |
| 4,357,387 A | 11/1982 | George et al. |
| 4,367,114 A | 1/1983 | Steinberg et al. |
| 4,469,619 A | 9/1984 | Ohno et al. |
| 4,534,816 A | 8/1985 | Chen et al. |
| 4,579,618 A | 4/1986 | Celestino et al. |
| 4,590,042 A | 5/1986 | Drage |
| 4,593,007 A | 6/1986 | Novinski |
| 4,612,077 A | 9/1986 | Tracy et al. |
| 4,649,858 A | 3/1987 | Sakai et al. |
| 4,780,169 A | 10/1988 | Stark et al. |
| 4,792,378 A | 12/1988 | Rose et al. |
| 4,820,371 A | 4/1989 | Rose |
| 4,842,683 A | 6/1989 | Cheng et al. |
| 4,854,263 A | 8/1989 | Chang et al. |
| 4,877,757 A | 10/1989 | York et al. |
| 4,985,102 A | 1/1991 | Chatsick et al. |
| 5,000,113 A | 3/1991 | Wang et al. |
| 5,006,220 A | 4/1991 | Hijikata et al. |
| 5,074,456 A | 12/1991 | Degner et al. |
| 5,126,102 A | 6/1992 | Takahashi et al. |
| 5,134,965 A | 8/1992 | Tokuda et al. |

(Continued)

FOREIGN PATENT DOCUMENTS

DE  94 21 671  7/1996

(Continued)

OTHER PUBLICATIONS

International Search Report of PCT/US06/000591 issued Sep. 21, 2007.

(Continued)

*Primary Examiner*—Michael Cleveland
*Assistant Examiner*—Keath T Chen

(57) ABSTRACT

The present invention presents a baffle assembly located in a plasma processing system, comprising a baffle carrier attached to the plasma processing system, and at least two baffle inserts having a plurality of passages therethrough, the at least two baffle inserts being supported by the baffle carrier.

16 Claims, 13 Drawing Sheets

U.S. PATENT DOCUMENTS

| | | | |
|---|---|---|---|
| 5,180,467 A | 1/1993 | Cook et al. | |
| 5,334,462 A | 8/1994 | Vine et al. | |
| 5,362,335 A | 11/1994 | Rungta | |
| 5,366,585 A | 11/1994 | Robertson et al. | |
| 5,367,838 A | 11/1994 | Visaisouk et al. | |
| 5,411,568 A | 5/1995 | Moore | |
| 5,423,936 A | 6/1995 | Tomita et al. | |
| 5,426,310 A | 6/1995 | Tamada et al. | |
| 5,429,070 A | 7/1995 | Campbell et al. | |
| 5,472,565 A | 12/1995 | Mundt et al. | |
| 5,484,752 A | 1/1996 | Waku et al. | |
| 5,489,449 A | 2/1996 | Umeya et al. | |
| 5,494,713 A | 2/1996 | Ootuki | |
| 5,521,790 A | 5/1996 | Ruckel et al. | |
| 5,529,657 A | 6/1996 | Ishii | |
| 5,534,356 A | 7/1996 | Mahulikar et al. | |
| 5,534,751 A | 7/1996 | Lenz et al. | |
| 5,551,190 A | 9/1996 | Yamagishi et al. | |
| 5,556,501 A | 9/1996 | Collins et al. | |
| 5,569,356 A | 10/1996 | Lenz et al. | |
| 5,593,540 A | 1/1997 | Tomita et al. | |
| 5,595,627 A | 1/1997 | Inazawa et al. | |
| 5,614,055 A | 3/1997 | Fairbairn et al. | |
| 5,637,237 A | 6/1997 | Oehrlein et al. | |
| 5,641,375 A | 6/1997 | Nitescu et al. | |
| 5,651,723 A | 7/1997 | Bjornard et al. | |
| 5,680,013 A | 10/1997 | Dornfest et al. | |
| 5,716,485 A | 2/1998 | Salimian et al. | |
| 5,725,960 A | 3/1998 | Konishi et al. | |
| 5,746,875 A | 5/1998 | Maydan et al. | |
| 5,759,360 A | 6/1998 | Ngan et al. | |
| 5,798,016 A | 8/1998 | Oehrlein et al. | |
| 5,820,723 A | 10/1998 | Benjamin et al. | |
| 5,834,070 A | 11/1998 | Movchan et al. | |
| 5,851,343 A | 12/1998 | Hsu et al. | |
| 5,856,240 A | 1/1999 | Sinha et al. | |
| 5,868,848 A | 2/1999 | Tsukamoto | |
| 5,879,575 A | 3/1999 | Tepman et al. | |
| 5,882,411 A | 3/1999 | Zhao et al. | |
| 5,885,356 A | 3/1999 | Zhao et al. | |
| 5,885,402 A | 3/1999 | Esquibel | |
| 5,888,907 A | 3/1999 | Tomoyasu et al. | |
| 5,891,253 A | 4/1999 | Wong et al. | |
| 5,891,350 A | 4/1999 | Shan et al. | |
| 5,892,278 A | 4/1999 | Horita | |
| 5,894,887 A | 4/1999 | Kelsey et al. | |
| 5,895,586 A | 4/1999 | Kaji et al. | |
| 5,900,064 A | 5/1999 | Kholodenko | |
| 5,900,103 A | 5/1999 | Tomoyasu et al. | |
| 5,902,763 A | 5/1999 | Waku et al. | |
| 5,904,778 A | 5/1999 | Lu et al. | |
| 5,911,852 A | 6/1999 | Katayama et al. | |
| 5,919,332 A | 7/1999 | Koshiishi et al. | |
| 5,925,228 A | 7/1999 | Panitz et al. | |
| 5,944,902 A | 8/1999 | Redeker et al. | |
| 5,948,521 A | 9/1999 | Dlugosch et al. | |
| 5,952,054 A | 9/1999 | Sato et al. | |
| 5,952,060 A | 9/1999 | Ravi | |
| 5,955,182 A | 9/1999 | Yasuda et al. | |
| 5,968,377 A | 10/1999 | Yuasa et al. | |
| 5,985,102 A | 11/1999 | Leiphart | |
| 5,994,662 A | 11/1999 | Murugesh | |
| 6,063,441 A | 5/2000 | Koai et al. | |
| 6,068,729 A | 5/2000 | Shrotriya | |
| 6,073,449 A | 6/2000 | Watanabe et al. | |
| 6,079,356 A | 6/2000 | Umotoy et al. | |
| 6,096,161 A | 8/2000 | Kim et al. | |
| 6,106,625 A | 8/2000 | Koai et al. | |
| 6,108,189 A | 8/2000 | Weldon et al. | |
| 6,110,287 A | 8/2000 | Arai et al. | |
| 6,120,640 A | 9/2000 | Shih et al. | |
| 6,120,955 A | 9/2000 | Tokutake et al. | |
| 6,123,791 A | 9/2000 | Han et al. | |
| 6,123,804 A | 9/2000 | Babassi et al. | |
| 6,129,044 A | 10/2000 | Zhao et al. | |
| 6,129,808 A | 10/2000 | Wicker et al. | |
| 6,139,983 A | 10/2000 | Ohashi et al. | |
| 6,143,646 A | 11/2000 | Wetzel | |
| 6,156,151 A | 12/2000 | Komino et al. | |
| 6,170,429 B1 | 1/2001 | Schoepp et al. | |
| 6,176,969 B1 * | 1/2001 | Park et al. | 156/345.29 |
| 6,182,603 B1 | 2/2001 | Shang et al. | |
| 6,210,486 B1 | 4/2001 | Mizukami et al. | |
| 6,221,202 B1 | 4/2001 | Walko, II | |
| 6,245,192 B1 | 6/2001 | Dhindsa et al. | |
| 6,246,479 B1 | 6/2001 | Jung et al. | |
| 6,264,788 B1 | 7/2001 | Tomoyasu et al. | |
| 6,265,757 B1 | 7/2001 | Brady et al. | |
| 6,266,133 B1 | 7/2001 | Miyajima et al. | |
| 6,296,716 B1 | 10/2001 | Haerle et al. | |
| 6,296,740 B1 | 10/2001 | Xie et al. | |
| 6,335,293 B1 | 1/2002 | Luo et al. | |
| 6,364,949 B1 | 4/2002 | Or et al. | |
| 6,368,987 B1 | 4/2002 | Kopacz et al. | |
| 6,373,573 B1 | 4/2002 | Jung et al. | |
| 6,383,333 B1 | 5/2002 | Haino et al. | |
| 6,383,964 B1 | 5/2002 | Nakahara et al. | |
| 6,387,817 B1 | 5/2002 | Buckfeller | |
| 6,394,026 B1 | 5/2002 | Wicker et al. | |
| 6,413,578 B1 | 7/2002 | Stowell et al. | |
| 6,415,736 B1 | 7/2002 | Hao et al. | |
| 6,444,083 B1 | 9/2002 | Steger et al. | |
| 6,464,843 B1 | 10/2002 | Wicker et al. | |
| 6,506,685 B2 | 1/2003 | Li et al. | |
| 6,514,377 B1 | 2/2003 | Morimoto | |
| 6,519,037 B2 | 2/2003 | Jung et al. | |
| 6,527,911 B1 | 3/2003 | Yen et al. | |
| 6,533,910 B2 | 3/2003 | O'Donnell et al. | |
| 6,537,419 B1 | 3/2003 | Kinnard | |
| 6,537,429 B2 | 3/2003 | O'Donnell et al. | |
| 6,544,380 B2 * | 4/2003 | Tomoyasu et al. | 156/345.51 |
| 6,554,906 B1 | 4/2003 | Kuibira et al. | |
| 6,562,186 B1 | 5/2003 | Saito et al. | |
| 6,570,654 B2 | 5/2003 | Jung et al. | |
| 6,583,064 B2 | 6/2003 | Wicker et al. | |
| 6,590,660 B2 | 7/2003 | Jung et al. | |
| 6,613,204 B2 | 9/2003 | Xie et al. | |
| 6,613,442 B2 | 9/2003 | O'Donnell et al. | |
| 6,627,901 B2 | 9/2003 | Martinez | |
| 6,632,549 B1 | 10/2003 | Ohashi et al. | |
| 6,641,697 B2 | 11/2003 | Han et al. | |
| 6,646,233 B2 | 11/2003 | Okuda et al. | |
| 6,663,714 B2 | 12/2003 | Mizuno et al. | |
| 6,673,198 B1 * | 1/2004 | Wicker | 156/345.48 |
| 6,676,803 B2 | 1/2004 | Kim | |
| 6,695,929 B2 | 2/2004 | Kanekiyo et al. | |
| 6,726,801 B2 | 4/2004 | Ahn | |
| 6,733,620 B1 | 5/2004 | Sugiyama et al. | |
| 6,738,862 B1 | 5/2004 | Ross et al. | |
| 6,738,863 B2 | 5/2004 | Butterworth et al. | |
| 6,771,483 B2 | 8/2004 | Harada et al. | |
| 6,776,873 B1 | 8/2004 | Sun et al. | |
| 6,783,863 B2 | 8/2004 | Harada et al. | |
| 6,783,875 B2 | 8/2004 | Yamada et al. | |
| 6,798,519 B2 | 9/2004 | Nishimoto et al. | |
| 6,805,135 B1 | 10/2004 | Hirota et al. | |
| 6,805,952 B2 | 10/2004 | Chang et al. | |
| 6,806,949 B2 | 10/2004 | Ludviksson et al. | |
| 6,811,651 B2 | 11/2004 | Long | |
| 6,830,622 B2 | 12/2004 | O'Donnell et al. | |
| 6,833,279 B2 | 12/2004 | Choi | |
| 6,837,966 B2 | 1/2005 | Nishimoto et al. | |
| 6,852,433 B2 | 2/2005 | Maeda | |
| 6,863,594 B2 | 3/2005 | Preising | |

| | | |
|---|---|---|
| 6,875,477 B2 | 4/2005 | Trickett et al. |
| 6,884,516 B2 | 4/2005 | Harada et al. |
| 6,894,769 B2 | 5/2005 | Ludviksson et al. |
| 6,896,785 B2 | 5/2005 | Shatrov et al. |
| 6,963,043 B2 | 11/2005 | Fink |
| 7,001,482 B2 | 2/2006 | Landis et al. |
| 7,137,353 B2 | 11/2006 | Saigusa et al. |
| 7,147,749 B2 | 12/2006 | Nishimoto et al. |
| 7,163,585 B2 | 1/2007 | Nishimoto et al. |
| 7,166,166 B2 | 1/2007 | Saigusa et al. |
| 7,166,200 B2 | 1/2007 | Saigusa et al. |
| 7,204,912 B2 | 4/2007 | Saigusa et al. |
| 7,282,112 B2 | 10/2007 | Nishimoto et al. |
| 7,300,537 B2 | 11/2007 | O'Donnell et al. |
| 7,311,797 B2 | 12/2007 | O'Donnell et al. |
| 7,364,798 B2 | 4/2008 | Harada et al. |
| 2001/0000104 A1 | 4/2001 | Li et al. |
| 2001/0003271 A1 | 6/2001 | Otsuki |
| 2001/0050144 A1 | 12/2001 | Nishikawa et al. |
| 2002/0011215 A1 | 1/2002 | Tei et al. |
| 2002/0018902 A1 | 2/2002 | Tsukatani et al. |
| 2002/0076508 A1 | 6/2002 | Chiang et al. |
| 2002/0086118 A1 | 7/2002 | Chang et al. |
| 2002/0086501 A1 | 7/2002 | O'Donnell et al. |
| 2002/0086545 A1 | 7/2002 | O'Donnell et al. |
| 2002/0086553 A1 | 7/2002 | O'Donnell et al. |
| 2002/0090464 A1 | 7/2002 | Jiang et al. |
| 2002/0142611 A1 | 10/2002 | O'Donnell et al. |
| 2002/0144785 A1 | 10/2002 | Srivastava et al. |
| 2002/0177001 A1 | 11/2002 | Harada et al. |
| 2003/0000648 A1 | 1/2003 | Park et al. |
| 2003/0010446 A1 | 1/2003 | Kajiyama et al. |
| 2003/0019579 A1 | 1/2003 | Ahn |
| 2003/0029563 A1 | 2/2003 | Kaushal et al. |
| 2003/0084848 A1 | 5/2003 | Long |
| 2003/0084849 A1 | 5/2003 | Shim |
| 2003/0092278 A1 | 5/2003 | Fink |
| 2003/0094135 A1 | 5/2003 | Komiya et al. |
| 2003/0113479 A1 | 6/2003 | Fukuda et al. |
| 2003/0150419 A1 | 8/2003 | Daragheh et al. |
| 2003/0200929 A1 | 10/2003 | Otsuki |
| 2003/0201069 A1 | 10/2003 | Johnson |
| 2003/0227258 A1 | 12/2003 | Strang et al. |
| 2004/0026372 A1 | 2/2004 | Takenaka et al. |
| 2004/0035364 A1 | 2/2004 | Tomoyoshi et al. |
| 2004/0040940 A1 | 3/2004 | Fink |
| 2004/0050495 A1 | 3/2004 | Sumiya et al. |
| 2004/0060516 A1 | 4/2004 | Nishimoto et al. |
| 2004/0060656 A1 | 4/2004 | Saigusa et al. |
| 2004/0060657 A1 | 4/2004 | Saigusa et al. |
| 2004/0060658 A1 | 4/2004 | Nishimoto et al. |
| 2004/0060661 A1 | 4/2004 | Nishimoto et al. |
| 2004/0060779 A1 | 4/2004 | Kreger |
| 2004/0061447 A1 | 4/2004 | Saigusa et al. |
| 2004/0063333 A1 | 4/2004 | Saigusa et al. |
| 2004/0072426 A1 | 4/2004 | Jung |
| 2004/0074605 A1 | 4/2004 | Nezu et al. |
| 2004/0081746 A1 | 4/2004 | Imafuku |
| 2004/0083970 A1 | 5/2004 | Imafuku et al. |
| 2004/0125359 A1 | 7/2004 | Ludviksson et al. |
| 2004/0168640 A1 | 9/2004 | Muto et al. |
| 2004/0173155 A1 | 9/2004 | Nishimoto et al. |
| 2004/0216667 A1 | 11/2004 | Mitsuhashi et al. |
| 2004/0244949 A1 | 12/2004 | Fink |
| 2005/0011447 A1 | 1/2005 | Fink |
| 2005/0041238 A1 | 2/2005 | Ludviksson et al. |
| 2005/0098265 A1 | 5/2005 | Fink |
| 2005/0103268 A1 | 5/2005 | Nishimoto et al. |
| 2005/0103275 A1 | 5/2005 | Sasaki et al. |
| 2005/0150866 A1 | 7/2005 | O'Donnell |
| 2005/0251990 A1 | 11/2005 | Choi et al. |
| 2005/0255257 A1 | 11/2005 | Choi et al. |
| 2006/0118045 A1 | 6/2006 | Fink |
| 2006/0134919 A1 | 6/2006 | Hamelin et al. |
| 2006/0151114 A1 | 7/2006 | Fink |
| 2006/0201662 A1 | 9/2006 | Gilbert et al. |
| 2006/0228496 A1 | 10/2006 | Choi et al. |

FOREIGN PATENT DOCUMENTS

| | | |
|---|---|---|
| EP | 03 26 318 | 8/1989 |
| EP | 0 508 731 | 10/1992 |
| EP | 0 573 057 | 12/1993 |
| EP | 0 799 904 | 10/1997 |
| EP | 0 814 495 | 12/1997 |
| EP | 0 841 838 | 5/1998 |
| EP | 1 069 603 | 1/2001 |
| EP | 1 081 749 | 7/2001 |
| EP | 1 156 130 | 11/2001 |
| GB | 2252567 | 8/1992 |
| JP | 59-186325 | 10/1984 |
| JP | 61-207566 | 9/1986 |
| JP | 62-067161 | 3/1987 |
| JP | 63-000450 | 1/1988 |
| JP | 64-039728 | 2/1989 |
| JP | 01-120328 | 5/1989 |
| JP | 01-312087 | 12/1989 |
| JP | 02-267967 | 11/1990 |
| JP | 03-115535 | 5/1991 |
| JP | 04-238882 | 8/1992 |
| JP | 05-070922 | 3/1993 |
| JP | 05-117064 | 5/1993 |
| JP | 05-121360 | 5/1993 |
| JP | 05-198532 | 8/1993 |
| JP | 05-238855 | 9/1993 |
| JP | 05-238859 | 9/1993 |
| JP | 06-011346 | 2/1994 |
| JP | 06-057396 | 3/1994 |
| JP | 06-136505 | 5/1994 |
| JP | 06-142822 | 5/1994 |
| JP | 06-196548 | 7/1994 |
| JP | 06-256926 | 9/1994 |
| JP | 06-287739 | 10/1994 |
| JP | 07-058013 | 3/1995 |
| JP | 07-126827 | 5/1995 |
| JP | 07-176524 | 7/1995 |
| JP | 07-226378 | 8/1995 |
| JP | 07-245295 | 9/1995 |
| JP | 08-037180 | 2/1996 |
| JP | 08-041309 | 2/1996 |
| JP | 08-081777 | 3/1996 |
| JP | 08-268751 | 10/1996 |
| JP | 08-339895 | 12/1996 |
| JP | 09-069554 | 3/1997 |
| JP | 09-228070 | 9/1997 |
| JP | 09-272987 | 10/1997 |
| JP | 10-004083 | 1/1998 |
| JP | 10-045461 | 2/1998 |
| JP | 10-045467 | 2/1998 |
| JP | 10-130884 | 5/1998 |
| JP | 10-214819 | 8/1998 |
| JP | 10-226869 | 8/1998 |
| JP | 10-251871 | 9/1998 |
| JP | 11-001757 | 1/1999 |
| JP | 11-080925 | 3/1999 |
| JP | 11-207161 | 8/1999 |
| JP | 11-233292 | 8/1999 |
| JP | 11-310451 | 11/1999 |
| JP | 11-312646 | 11/1999 |
| JP | 2000-119840 | 4/2000 |
| JP | 2000-124197 | 4/2000 |
| JP | 2000-303180 | 10/2000 |
| JP | 2001-031484 | 2/2001 |
| JP | 2001-152307 | 6/2001 |
| JP | 2001-164354 | 6/2001 |
| JP | 2001-226773 | 8/2001 |

| | | |
|---|---|---|
| JP | 2002-151473 | 5/2002 |
| JP | 2002-252209 | 9/2002 |
| JP | 2003-166043 | 6/2003 |
| KR | 1991-002451 | 4/1991 |
| KR | 1994-008937 | 9/1994 |
| KR | 1998-063542 | 10/1998 |
| KR | 1999-008142 | 1/1999 |
| KR | 1999-13565 | 2/1999 |
| KR | 2002-0027373 | 4/2002 |
| KR | 10-2004-0007601 | 1/2004 |
| WO | WO 99/50886 | 10/1999 |
| WO | WO 01/42526 | 6/2001 |
| WO | WO 02/39495 | 5/2002 |
| WO | WO 02/48421 | 6/2002 |
| WO | WO 2004/030011 | 4/2004 |
| WO | WO 2004/030012 | 4/2004 |
| WO | WO 2004/030013 | 4/2004 |
| WO | WO 2004/030014 | 4/2004 |
| WO | WO 2004/030015 | 4/2004 |
| WO | WO 2004/030020 | 4/2004 |
| WO | WO 2004/030426 | 4/2004 |
| WO | WO 2004/095530 | 11/2004 |
| WO | WO 2004/095532 | 11/2004 |

OTHER PUBLICATIONS

International Preliminary Report on Patentability issued in counterpart International Application No. PCT/US2006/000591, dated Oct. 18, 2007.
Office Action issued in copending related U.S. Appl. No. 11/006,544, mailed Nov. 13, 2007.
Final Office Action issued in U.S. Appl. No. 11/091,775, mailed Mar. 5, 2009.
Notice of Allowance and Fees Due issued in related U.S. Appl. No. 11/006,544, mailed on Mar. 27, 2009.
Supplemental notice of allowability issued in related U.S. Appl. No. 11/006,544, mailed on May 19, 2009.
www.zircaceramics.com, Product Information, Dec. 22, 2004.
Production drawing for Deposition Shield, Upper believed to be sold in the U.S. on Apr. 12, 2000.
Production drawing for Deposition Shield believed to be sold in the U.S. prior to Sep. 30, 2001.
Production drawing for Upper Electrode believed to be sold in the U.S. prior to Sep. 30, 2001.
Hee Jee Kim, "Plasma-Sprayed Alumina-Yttria ceramic Coatings for Caviation-Erosion Protection," Sep. 1989, pp. 139-146.
JIS Using Series, "Spraying Techniques Manual", p. 95 (Oct. 30, 1998, Japanese Standard Association), with English translation.
Yousha Gitjutsu Handbook, 1st Edition, Japan Thermal Spraying Society, Techno Consultants, Inc., pp. 3, 316-317 (1998).
Office Action in U.S. Appl. No. 11/006,544, mailed May 25, 2007.
Office Action in U.S. Appl. No. 11/006,544, mailed Oct. 12, 2006.
Office Action in U.S. Appl. No. 11/091,775, mailed Oct. 6, 2008.
Office Action in U.S. Appl. No. 10/889,220, mailed Nov. 30, 2006.
Office Action in U.S. Appl. No. 10/889,220, mailed Jun. 21, 2006.
http://lionreference.chadwyck.com/searchFulltext.do/id=15804750&,idType=offset&divLevel=2&queryId=../session/1164482997_16084&area=mwd&forward=refshelf&trail=refshelf.
Office Action in U.S. Appl. No. 11/567,023, mailed May 5, 2008.
Office Action in U.S. Appl. No. 11/584,525, mailed Jul. 1, 2008.
Office Action in U.S. Appl. No. 11/581,000, mailed May 15, 2008.
Office Action in U.S. Appl. No. 10/450,094, mailed Dec. 1, 2005.
Office Action in U.S. Appl. No. 10/450,094, mailed Aug. 15, 2006.
Office Action in U.S. Appl. No. 10/450,094, mailed Mar. 20, 2007.
Office Action in U.S. Appl. No. 10/450,094, mailed Jan. 7, 2008.
Office Action in U.S. Appl. No. 11/980,570, mailed Jul. 25, 2008.
Office Action in U.S. Appl. No. 11/980,596, mailed Jul. 29, 2008.
Office Action in U.S. Appl. No. 10/444,957, mailed Jun. 9, 2004.
Office Action in U.S. Appl. No. 10/444,957, mailed Nov. 18, 2004.
Office Action in U.S. Appl. No. 10/444,957, mailed Jun. 7, 2005.
Office Action in U.S. Appl. No. 10/444,957, mailed Nov. 7, 2005.
Office Action in U.S. Appl. No. 10/444,957, mailed Aug. 1, 2006.
Office Action in U.S. Appl. No. 10/444,957, mailed Apr. 25, 2007.
Office Action in U.S. Appl. No. 10/444,957, mailed Oct. 5, 2007.
Office Action in U.S. Appl. No. 10/444,957, mailed Jul. 28, 2008.
Office Action in U.S. Appl. No. 10/722,602, mailed Mar. 2, 2006.
Office Action in U.S. Appl. No. 10/722,602, mailed Aug. 17 2006.
Office Action in U.S. Appl. No. 10/722,602, mailed May 4, 2007.
Office Action in U.S. Appl. No. 10/722,602, mailed Oct. 25, 2007.
Office Action in U.S. Appl. No. 10/722,602, mailed May 21,2008.
English language abstract of JP 01-312087 published Dec. 1989.
English language abstract of JP 02-267967, published Nov. 1990.
English language abstract of JP 03-115535, published May 1991.
English language abstract of JP 04-238882, published Aug. 1992.
Machine English language translation of JP 05-070922, published Mar. 1993.
Machine English language translation of JP 05-117064, published May 1993.
Machine English language translation of JP 05-121360, published May 1993.
Machine English language translation of JP 05-198532, published Aug. 1993.
Machine English language translation of JP 05-238859, published Sep. 1993.
Machine English language translation of JP 06-057396, published Mar. 1994.
Machine English language translation of JP 06-136505, published May 1994.
Machine English language translation of JP 06-142822, published May 1994.
Machine English language translation of JP 06-256926, published Sep. 1994.
Machine English language translation of JP 07-058013, published Mar. 1995.
Machine English language translation of JP 07-126827, published May 1995.
Machine English language translation of JP 07-176524, published Jul. 1995.
Machine English language translation of JP 07-226378, published Aug. 1995.
Machine English language translation of JP 07-245295, published Sep. 1995.
Machine English language translation of JP 08-037180, published Feb. 1996.
Machine English language translation of JP 08-041309, published Feb. 1996.
Machine English language translation of JP 08-081777, published Mar. 1996.
Machine English language translation of JP 08-268751, published Oct. 1996.
Machine English language translation of JP 08-339895, publishec Dec. 1996.
Machine English language translation of JP 09-069554, published Mar. 1997.
Machine English language translation of JP 09-272987, published Oct. 1997.
Machine English language translation of JP 10-004083, published Jan. 1998.
Machine English language translation of JP 10-045461, published Feb. 1998.
Machine English language translation of JP 10-045467, published Feb. 1998.
Machine English language translation of JP 10-130884, published May 1998.
Machine English language translation of JP 10-214819, published Aug. 1998.
Machine English language translation of JP 10-251871, published Sep. 1998.
Machine English language translation of JP 11-080925, published Mar. 1999.
Machine English language translation of JP 11-207161, published Aug. 1999.
Machine English language translation of JP 11-233292, published Aug. 1999.

Machine English language translation of JP 11-312646, published Nov. 1999.
Machine English language translation of JP 2000-124197, published Apr. 2000.
Machine English language translation of JP 2001-031484, published Feb. 2001.
Machine English language translation of JP 2001-152307, published Jun. 2001.
Machine English language translation of JP 2001-164354, published Jun. 2001.
Machine English language translation of JP 2001-226773, published Aug. 2001.
Machine English language translation of JP 2002-151473, published May 2002.
Machine English language translation of JP 2000-119840, published Apr. 2000.
Machine English language translation of JP 06-011346, published Feb. 1994.
English language abstract of JP 01-120328, published May 1989.
Machine English language translation of JP 11-310451, published Nov. 1999.
Machine English language translation of JP 05-238855, published Sep. 1993.
Machine English language translation of JP 06-196548, published Jul. 1994.
Machine English language translation of JP 2000-303180, published Oct. 2000.
Machine English language translation of JP 06-287739, published Oct. 1994.
Machine English language translation of JP 09-228070, published Sep. 1997.
Machine English language translation of JP 10-226869, published Aug. 1998.
Machine English language translation of JP 11-001757, published Jan. 1999.
English language abstract of JP 61-207566, published Sep. 1986.
English language abstract of JP 64-039728, published Feb. 1989.
English language abstract of JP 62-067161, published Mar. 1987.
English language abstract of JP 63-000450, published Jan. 1988.
International Search Report issued in International Application No. PCT/US05/36873, mailed Oct. 24, 2006.
Written Opinion issued in International Application No. PCT/US05/36873, mailed Oct. 24, 2006.
Office Action in U.S. Appl. No. 10/705,224, mailed Apr. 24, 2008.
Office Action in U.S. Appl. No. 10/705,224, mailed Jan. 18, 2008.
Office Action in U.S. Appl. No. 10/705,224, mailed Apr. 5, 2007.
Office Action in U.S. Appl. No. 10/705,224, mailed Mar. 7, 2006.
Office Action in U.S. Appl. No. 10/705,224, mailed Jun. 29, 2005.
Machine English language translation of JP 2002-252209, published Sep. 2002.
Machine English language translation of JP 2003-166043, published Jun. 2003.
Office Action issued in Taiwanese Application No. 93134237, mailed Jul. 16, 2007.
English language translation of Office Action issued in Taiwanese Application No. 93134237, mailed Jul. 16, 2007.

* cited by examiner

PLASMA PROCESSING SYSTEM AND BAFFLE ASSEMBLY FOR USE IN PLASMA PROCESSING SYSTEM

CROSS-REFERENCE TO RELATED APPLICATIONS

This application is related to U.S. Pat. No. 6,837,966 and U.S. application Ser. No. 10/647,469, filed Aug. 26, 2003 now U.S. Pat. No. 6,963,043, Ser. No. 10/705,224, filed Nov. 12, 2003 now U.S. Pat. No. 7,461,614, and Ser. No. 11/006,544, filed Dec. 8, 2004 now U.S. Pat. No. 7,552,521. The entire contents of each of this patent and these patent applications are herein incorporated by reference in their entirety.

FIELD OF THE INVENTION

The present invention relates to a component for a plasma processing system and, more particularly, to a baffle assembly employed in plasma processing system surrounding a substrate holder.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g. chamber pressure, gas flow rate, etc.) are chosen to produce a population of charged species and chemically reactive species suitable to the particular process being performed within the chamber (e.g. etching processes where materials are removed from the substrate or deposition processes where materials are added to the substrate). In general, a vacuum pump provides a reduced pressure atmosphere in a plasma processing chamber. A (pumping) baffle plate comprising a plurality of small passages therethrough is located between the plasma and the pump to confine the plasma while permitting gas to be evacuated. The baffle plate's surface can be exposed to the physically and chemically active plasma, and, in time, can erode. So the baffle plate should be cleaned or replaced periodically.

SUMMARY OF THE INVENTION

The present invention provides a baffle assembly located in a plasma processing system having a chuck assembly for holding a substrate. The baffle assembly includes a baffle carrier attached to the plasma processing system and at least two baffle inserts having a plurality of passages therethrough. The baffle inserts are supported by the baffle carrier.

BRIEF DESCRIPTION OF THE DRAWINGS

These and other aspects of the invention will become more apparent and more readily appreciated from the following detailed description of the exemplary embodiments of the invention taken in conjunction with the accompanying drawings, where.

DETAILED DESCRIPTION OF SEVERAL EMBODIMENTS

Figure 1:
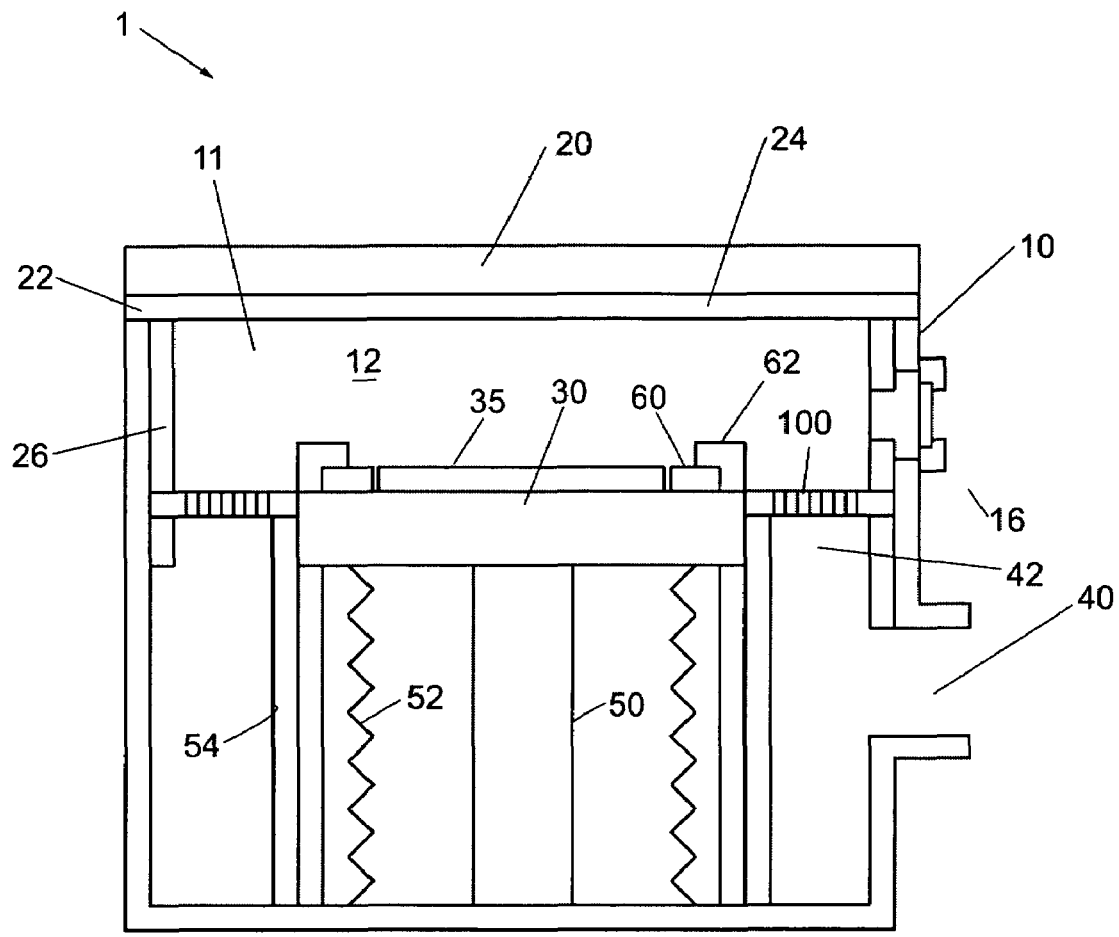
FIG. 1 shows a simplified block diagram of a plasma processing system comprising a baffle plate according to an embodiment of the present invention.

According to an embodiment of the present invention, a plasma processing system 1 depicted in FIG. 1 comprises a plasma processing chamber 10, an upper assembly 20 for covering the plasma processing chamber, an upper electrode 22 coupled to the upper assembly 20, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of processing plasma in process space 12 adjacent to substrate 35. In the plasma processing system a passageway 42 is formed between the process space 12 and the pumping duct 40. The plasma processing system 1 can be configured to process 200 mm substrates, 300 mm substrates, or substrates of any size.

In the illustrated embodiment, upper electrode 22 comprises an electrode plate 24 with a deposition shield 26. In an alternate embodiment, upper assembly 20 can comprise a cover, a gas injection assembly, or an upper electrode impedance match network, or any combination of two or more thereof. For example, the upper electrode 22 can be coupled to an RF source. In another alternate embodiment, the upper assembly 20 comprises a cover coupled to the upper electrode 22, wherein the upper electrode 22 is maintained at an electrical potential equivalent to that of the plasma processing chamber 10. For example, the plasma processing chamber 10, the upper assembly 20, and the upper electrode 22 can be electrically connected to ground potential.

Plasma processing chamber 10 can further comprise an optical viewport 16 coupled to the deposition shield 26 of upper electrode 22. Optical viewport 16 can permit monitoring of optical emission from the processing plasma in process space 12.

Chuck assembly 30 for holding substrate 35 can further comprise a vertical translational device 50 surrounded by a bellows 52 coupled to the chuck assembly 30 and the plasma processing chamber 10, and configured to seal the vertical translational device 50 from the reduced pressure atmosphere 11 in plasma processing chamber 10. Additionally, a bellows shield 54 can be coupled to the chuck assembly 30 and configured to protect the bellows 52 from the processing plasma.

The plasma processing system 1 further comprises a focus ring 60, a shield ring 62, and a baffle assembly 100.

Figure 2A:
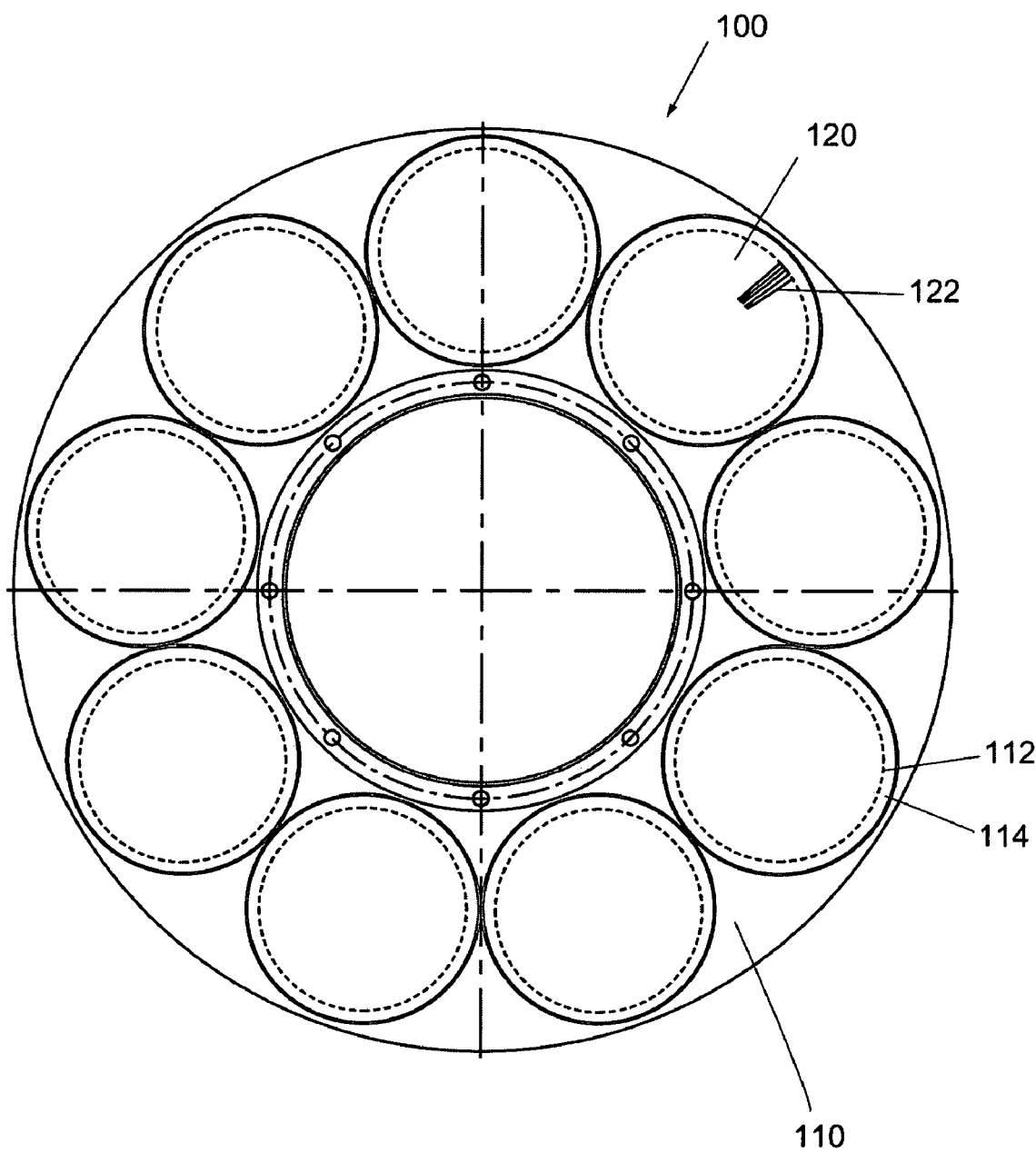
FIG. 2A shows a plan view of a baffle assembly for a plasma processing system according to an embodiment of the present invention.

Referring now to an illustrated embodiment of the present invention depicted in FIG. 2A, the baffle assembly 100 comprises a baffle carrier 110 that can be attached to the chuck assembly 30 or to the processing chamber 10 and at least two baffle inserts 120. The embodiment of the baffle assembly 100 shown in FIG. 2A comprises nine baffle inserts 120. Of course, any number of baffle inserts 120 may be employed.

The baffle inserts 120 can be disc-shaped. All the baffle inserts 120 can have the same shape, making baffle inserts 120 exchangeable.

Figure 2B:
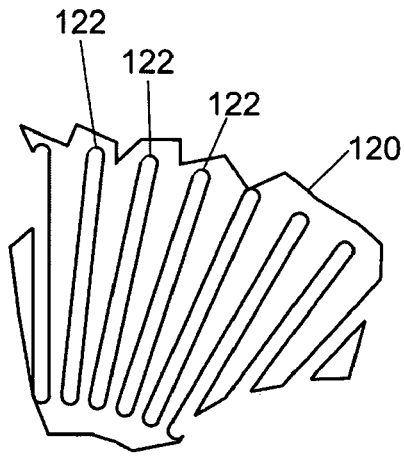
FIGS. 2B-2E show a variety of passages which may be employed in the baffle inserts.
Figure 2C:
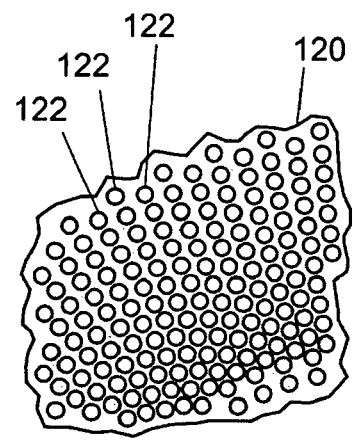
Figure 2D:
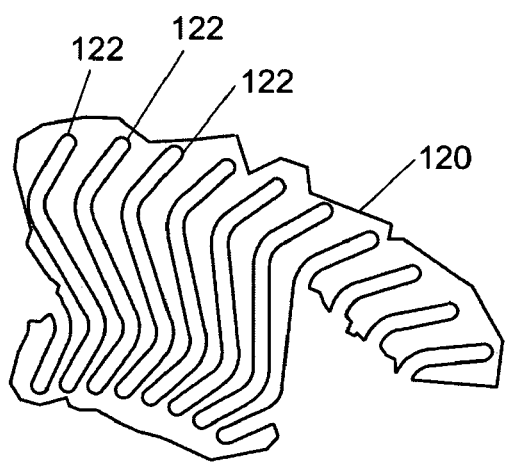
Figure 2E:
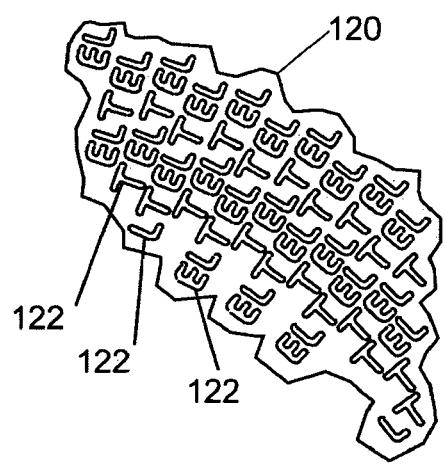

The baffle inserts 120 comprises a plurality of passages 122 therethrough in order to permit gas in the process space 12 to be removed by the vacuum pump. Various shapes and geometries can be utilized for the passages 122 as shown in FIGS. 2B, 2C, 2D, or 2E. Referring now to FIG. 2B, each passage 122 can have a slot shape and extend radially. As shown in FIG. 2C, each passage 122 can have a round shape. Although the passages can be formed in any different distribution, the illustrated passages 122 have a higher density near the chuck assembly 30 than away from the chuck assembly 30. Referring FIG. 2D, each passage 122 can have a jagged shape. FIG. 2E illustrates that passages 122 can have letter shapes. In the embodiment "T", "E", and "L" shapes are used. Of course, any open polygon shape including letters or characters of any language can be used.

The baffle carrier 110, as depicted FIG. 2A, is formed into a ring surrounding the chuck assembly 30 and can be secured to the chuck assembly 30 with, for example, threaded hardware (not shown). The baffle carrier 110 comprises holes 112 corresponding to the baffle inserts 120. In the embodiment each hole 112 can be formed into a round shape having a diameter smaller than a diameter of the baffle insert 120. Thus the holes 112 do not permit the baffle insert 120 to pass therethrough. Flanges 114 can be formed at the rims of the holes 112. The flanges 114 can have upper surfaces lower than the upper surface of the baffle carrier 110, enabling the baffle inserts 120 to rest thereon. The baffle inserts 120 can be attached to baffle carrier 110 or the baffle inserts 120 can merely lie on baffle carrier 110.

Figure 3:
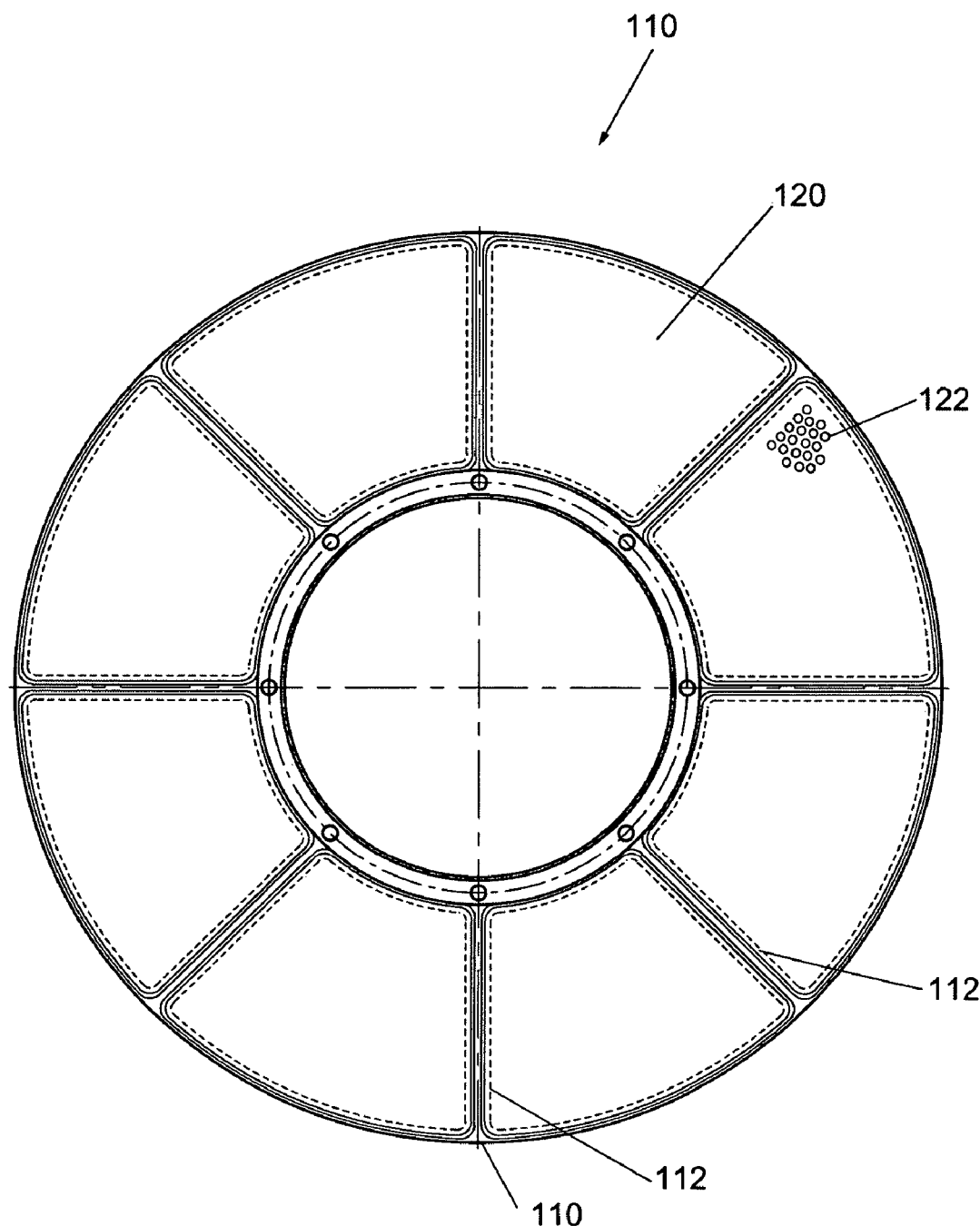
FIG. 3 shows a plan view of a baffle assembly for a plasma processing system according to an embodiment of the present invention.

Another embodiment of the present invention is illustrated in FIG. 3. In the embodiment a baffle assembly 100 has eight baffle inserts 120 but can have at least two baffle inserts. The baffle inserts 120 can be distributed to adjoin each other and substantially cover the passageway 42. The baffle inserts 120 comprise small passages 122 therethrough. Although passages 122 are round in the illustrated embodiment, the passages 122 can be placed into any kind of disposition and be formed in any shape, such as, for example, those shapes shown in FIG. 2B, 2C, 2D, or 2E. The baffle inserts 120 can be formed into the same fan shape, enabling them to be exchanged with each other. Thus the baffle inserts 120 function as exchangeable modular parts.

The baffle assembly 100 comprises a baffle carrier 110 for supporting the baffle inserts 120. The baffle carrier 110 defines holes 112 corresponding to the baffle inserts 120. The holes 112 have a similar shape as the baffle inserts 120 and can be formed smaller than the baffle inserts 120 so that the periphery of the baffle inserts 120 can be supported by the baffle carrier 110. In this embodiment the baffle inserts 120 lie on the baffle carrier 100 and are not secured to any part of the plasma processing system 1. Alternatively, baffle inserts 120 can be fastened to baffle carrier 100.

Figure 4A:
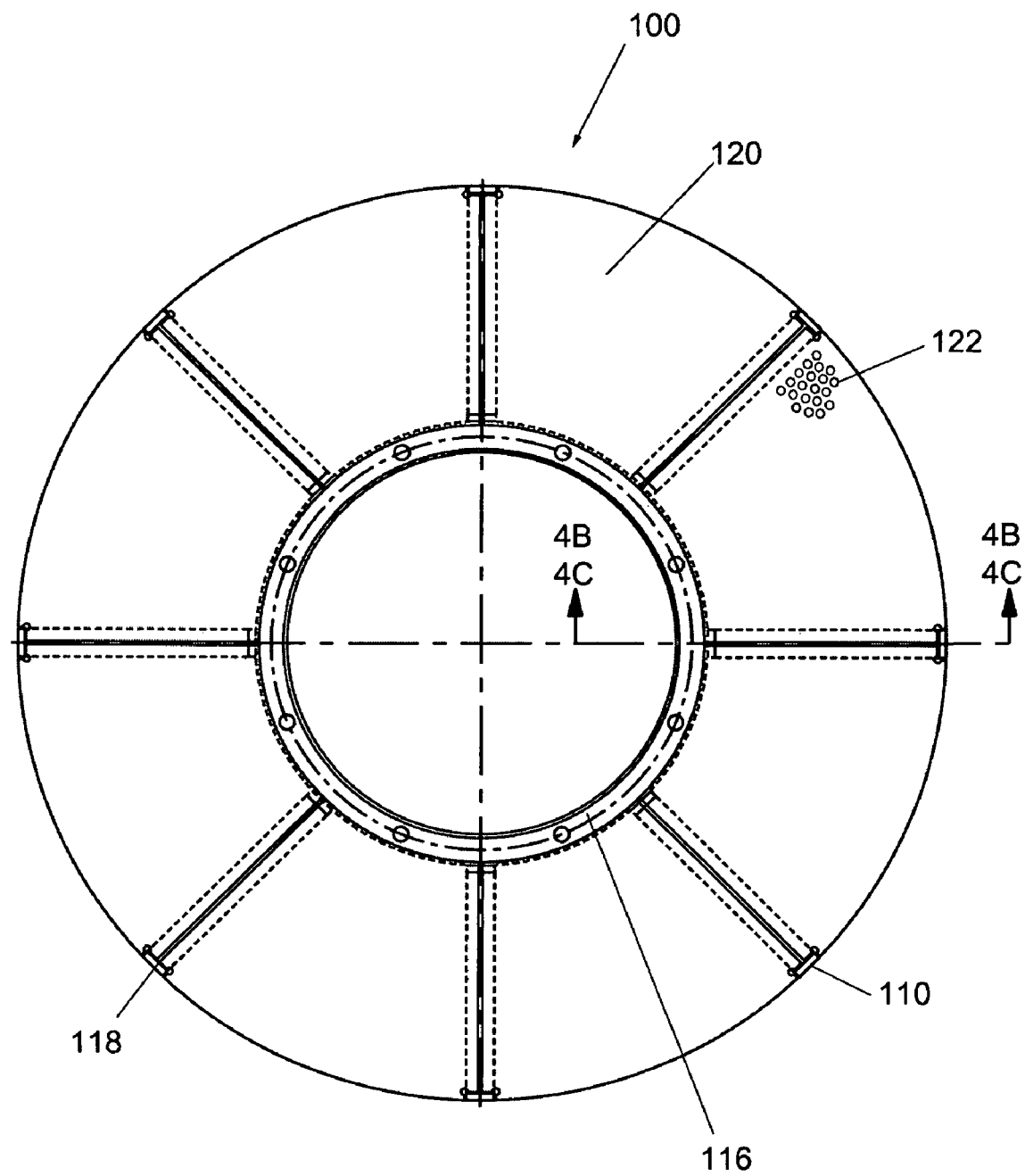
FIG. 4A shows a plan view of a baffle assembly for a plasma processing system according to an embodiment of the present invention.
Figure 4B:
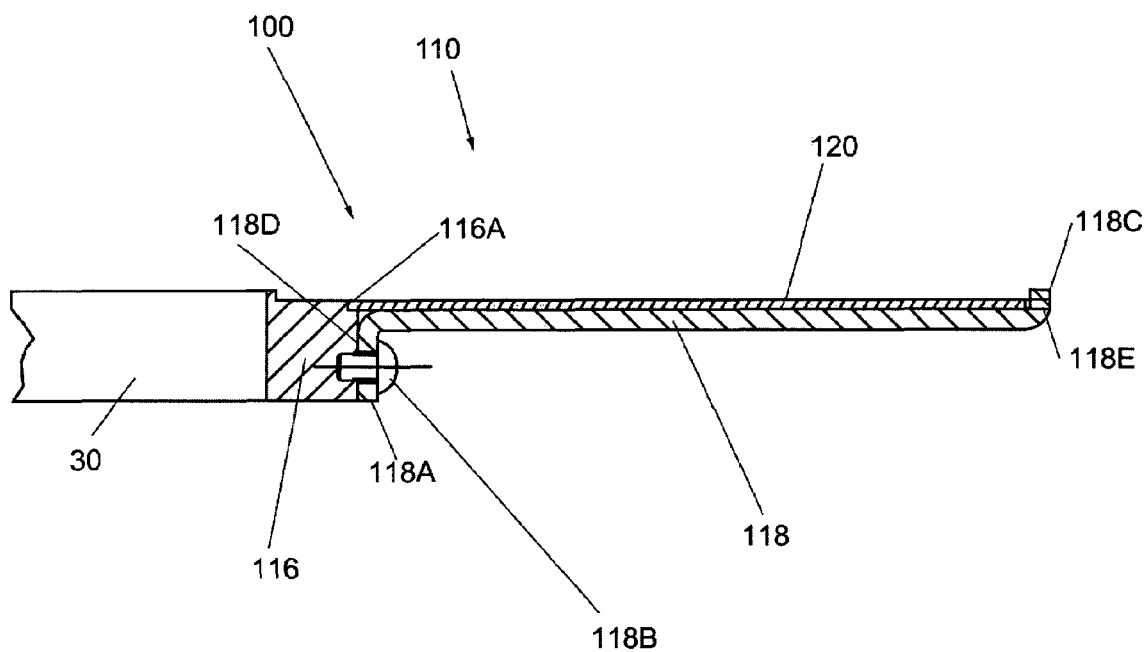
FIG. 4B shows a cross sectional view of a baffle assembly for a plasma processing system according to the embodiment of FIG. 4A.

Another embodiment of the present invention is illustrated in FIGS. 4A and 4B. The baffle assembly 100 comprises a baffle carrier 110 and baffle inserts 120. The baffle carrier 110 comprises baffle carrier ring 116 surrounding the chuck assembly 30, and baffle carrier supports 118 mounted to the baffle carrier ring 116. In the illustrated embodiment the baffle carrier 110 has eight baffle carrier supports 118, but any number of baffle carrier supports can be chosen for supporting a corresponding number of baffle inserts 120. The baffle inserts 120 comprise small passages 122 therethrough. Although the baffle inserts 120 comprise round shape passages 122 in the illustrated embodiment, the passages 122 can be placed into any kind of disposition and be formed in any shape, such as, for example, those shapes shown in FIG. 2B, 2C, 2D, or 2E.

Figure 4C:
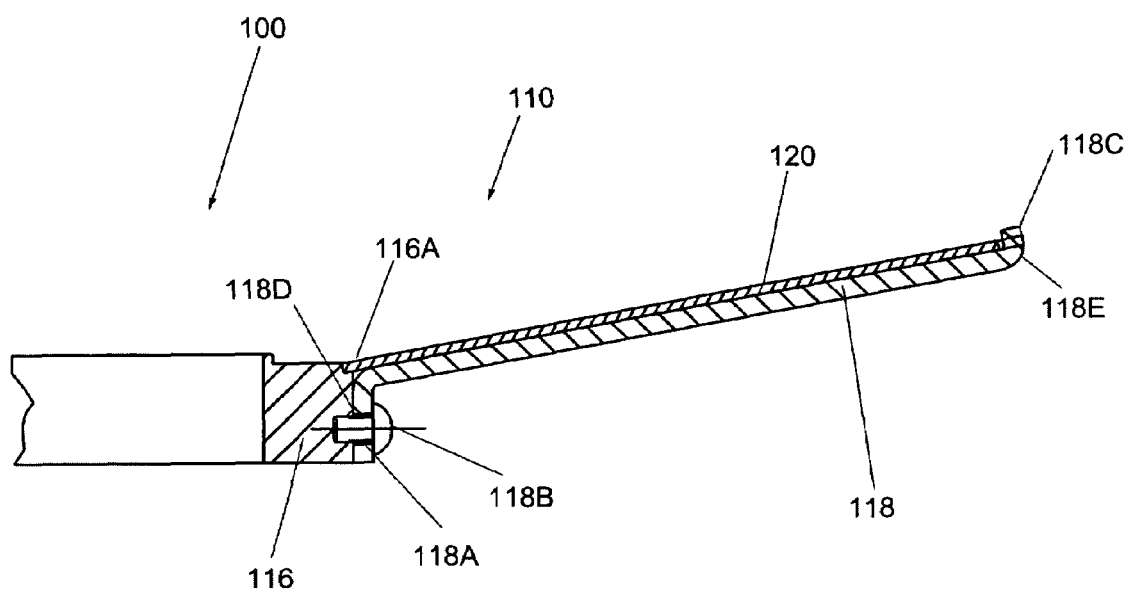
FIG. 4C shows a cross sectional view of a baffle assembly for a plasma processing system according to an alternative embodiment to FIG. 4B.

As shown FIG. 4B, the baffle carrier supports 118 can be secured to the baffle carrier ring 116 attached to the chuck assembly 30. Specifically, the baffle carrier supports comprise tabs 118A on the first ends 118D and the tabs 118A can be attached to the baffle carrier ring 116 with mounting hardware 118B. The baffle carrier supports 118 have small projections 118C above the second ends 118E thereof so that the baffle inserts 120 can be positioned on the baffle carrier supports 118. Further, a small indent 116A can be formed on the top of the baffle carrier ring 116 to position the baffle inserts between the projections 118C and the indent 116A. The baffle carrier supports 118 can be placed substantially horizontally. Thus the baffle inserts 120 can be kept substantially horizontal. On the other hand, the baffle carrier supports 118 are placed can be positioned at angles other than horizontal. For example, as shown in FIG. 4C, the baffle carrier supports 118 can be inclined relative to horizontal. Specifically, the second ends 118E of the baffle carrier supports 118 depicted in FIG. 4C are positioned higher than the first ends 118D. Thus the baffle inserts 120 are positioned at an incline.

Figure 5A:
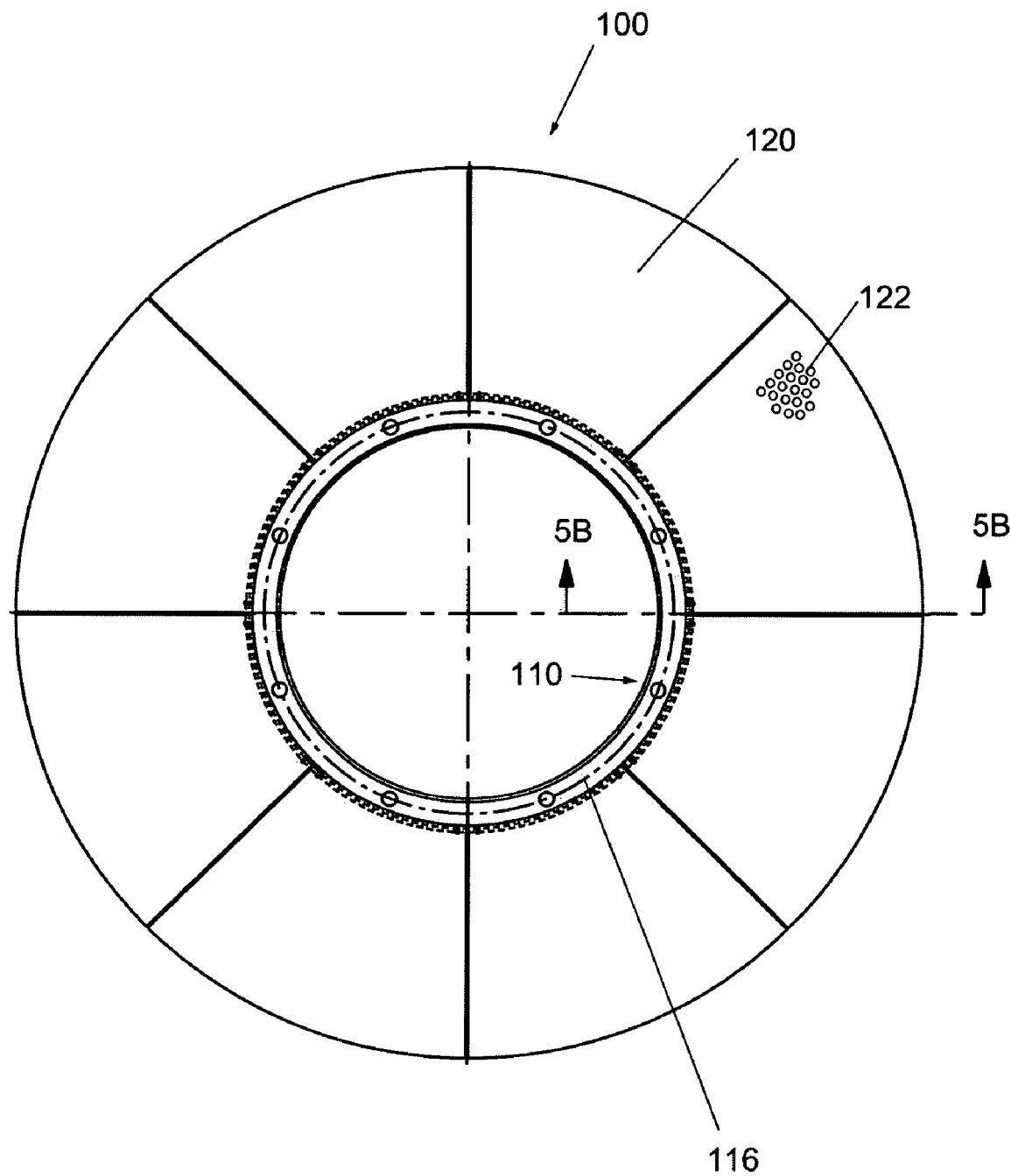
FIG. 5A shows a plan view of a baffle assembly for a plasma processing system according to an embodiment of the present invention.
Figure 5B:
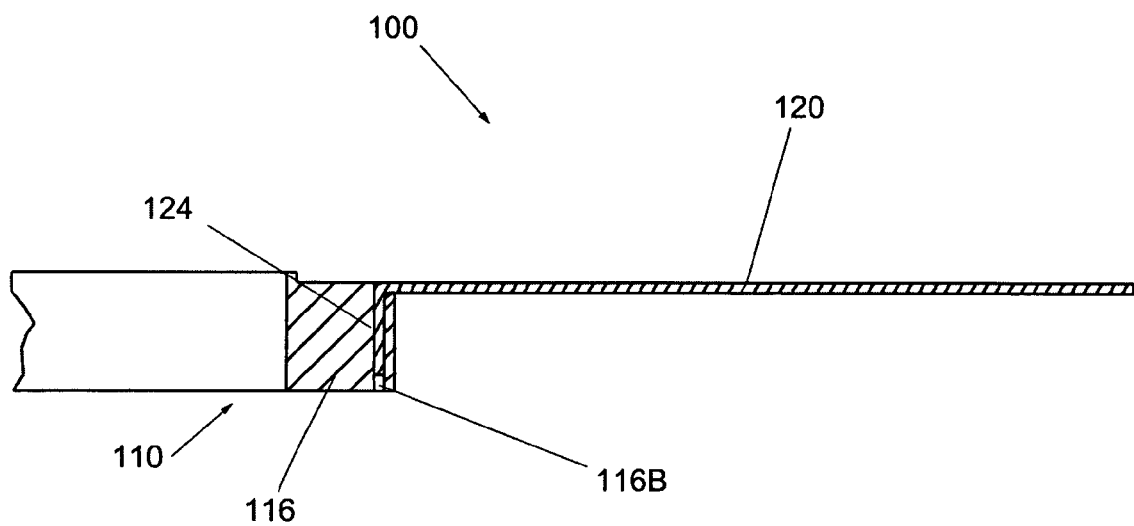
FIG. 5B shows a cross sectional view of a baffle assembly for a plasma processing system according to the embodiment of FIG. 5A.

Another embodiment of the present invention is illustrated in FIGS. 5A and 5B. In this embodiment, the baffle assembly 100 comprises baffle inserts 120 substantially screening the passageway 42, and a baffle carrier 110 for supporting the baffle inserts 120. The baffle inserts 120 can be formed into the same fan shape, enabling them to be exchanged with each other. Thus the baffle inserts 120 function as exchangeable modular parts. The baffle inserts 120 comprise small passages 122 therethrough. Although the baffle inserts 120 comprise round shape passages 122 in the illustrated embodiment, the passages 122 can be placed into any kind of disposition and be formed into any shape, such as, for example, those shapes shown in FIG. 2B, 2C, 2D, or 2E.

Baffle carrier 110 comprises a baffle carrier ring 116 secured to the chuck assembly 30. In the embodiment shown in FIG. 5B the baffle carrier 110 consists of a baffle carrier ring 116 surrounding the chuck assembly 30. The baffle carrier ring 116 defines a retaining slit 116B comprising an opening extending downwardly from the top surface of the baffle carrier ring 116.

The baffle inserts 120 have baffle tabs 124 which can be inserted into the retaining slit 116B to support the baffle inserts 120. The shape of baffle tabs 124 can be formed to be readily inserted into the retaining slit 116B and be readily removed from the retaining slit 116B.

Figure 6A:
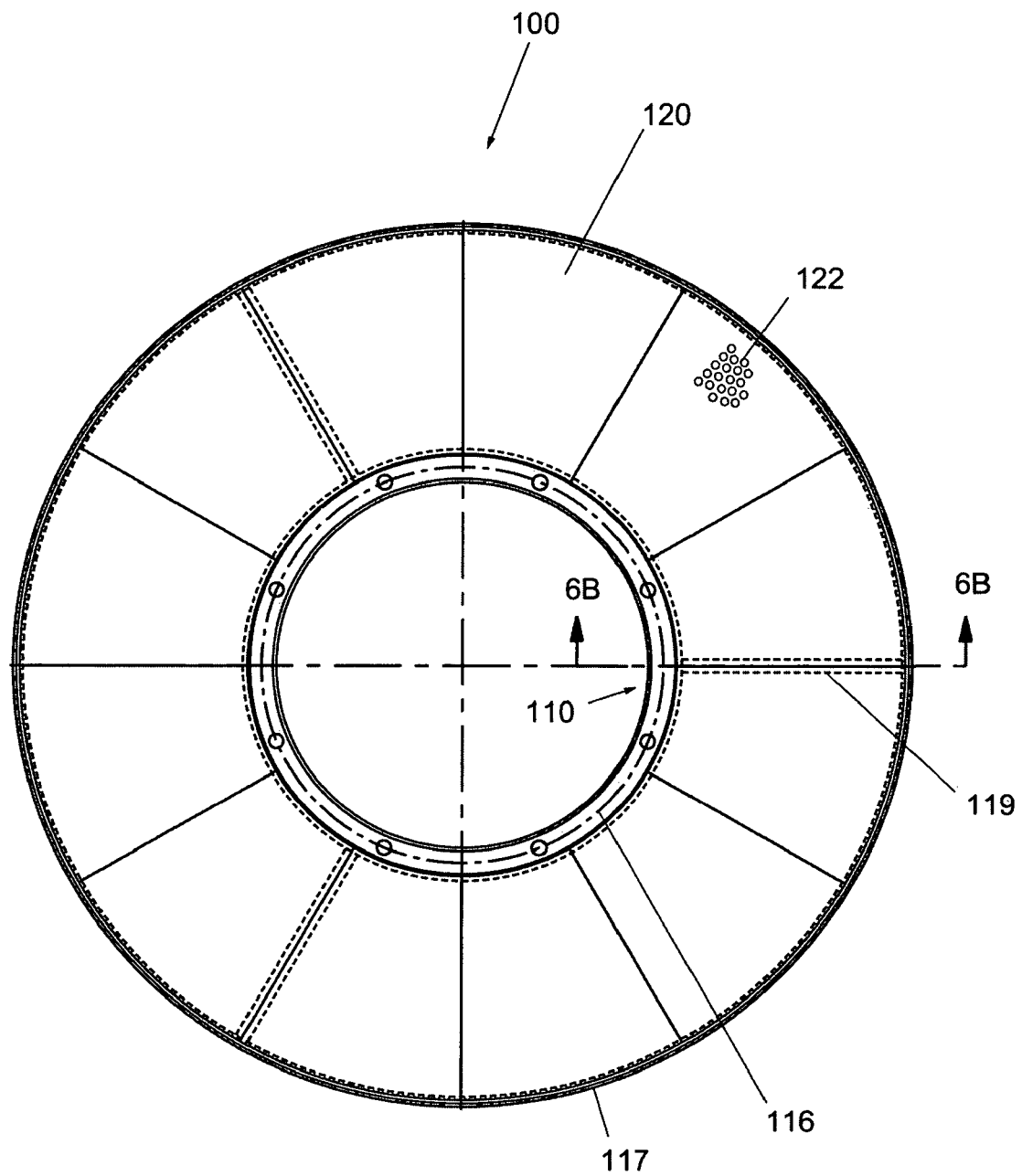
FIG. 6A shows a plan view of a baffle assembly for a plasma processing system according to an embodiment of the present invention.
Figure 6B:
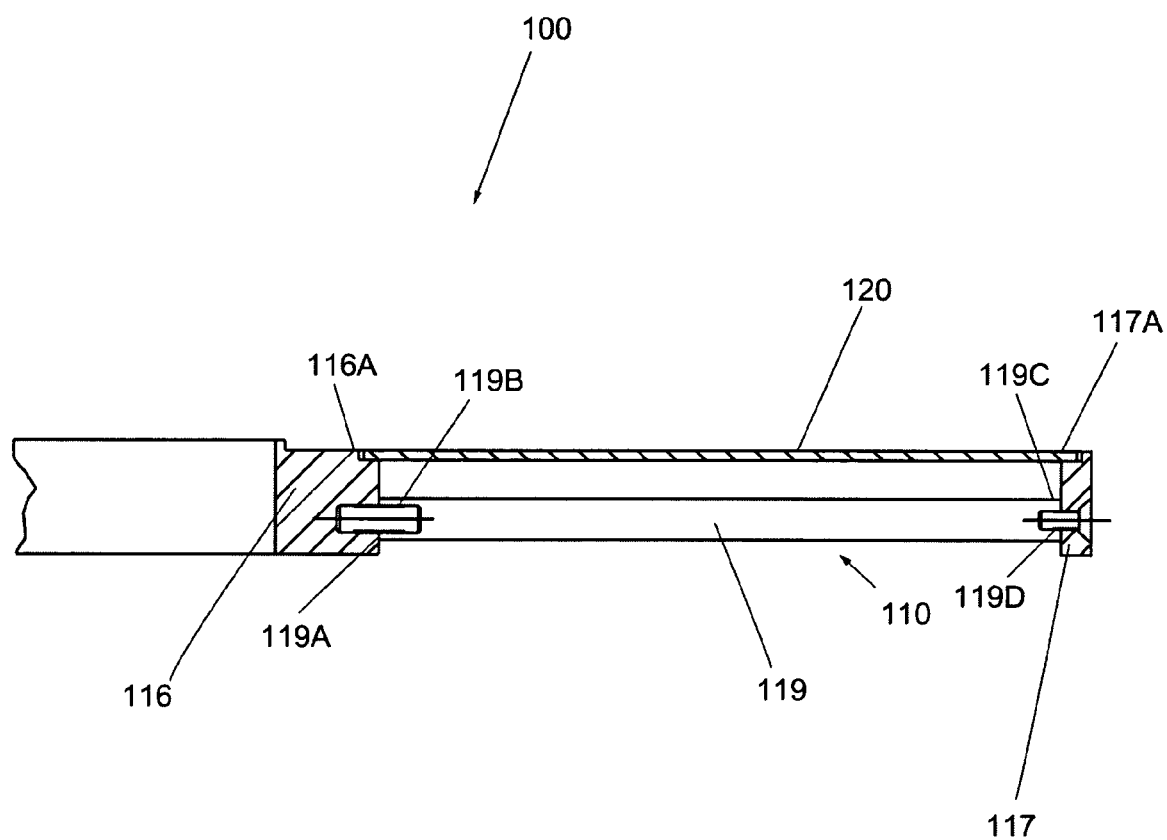
FIG. 6B shows a cross sectional view of a baffle assembly for a plasma processing system according to the embodiment of FIG. 6A.

Another embodiment of the present invention is illustrated in FIGS. 6A and 6B. In this embodiment the baffle assembly 100 comprises baffle inserts 120 substantially screening the passageway 42, and a baffle carrier 110 for supporting the baffle inserts 120. The baffle inserts 120 are formed into the same shape, enabling them to be exchanged each other. Thus the baffle inserts 120 function as exchangeable modular parts. The baffle inserts 120 comprise small passages 122 therethrough. Although the baffle inserts 120 comprise round shape passages 122 in the embodiment, the passages 122 can be placed into any kind of disposition and be formed into any kind of shapes, such as, for example, those shapes shown in FIG. 2B, 2C, 2D, or 2E.

The baffle carrier 110 can comprise a first baffle carrier ring 116 surrounding the chuck assembly 30, a second baffle carrier 117 positioned adjacent to the inside of the side wall of the chamber 10, and support rods 119 located between the first baffle carrier ring 116 and the second baffle carrier ring 117. The first baffle carrier ring 116 can be secured to the chuck assembly 30. Alternatively, or in addition, the second baffle carrier ring 117 can be attached to the chamber 10. First ends 119A of the support rods 119 are coupled to the first baffle carrier ring 116 with first mounting hardware 119B. The second baffle ring 117 can be secured to the second ends 119C of the support rods 119 with second mounting hardware 119D. The first baffle carrier ring 116 and the second baffle carrier ring 117 can be at substantially the same height so that the baffle inserts 120 can be horizontally supported by the first baffle carrier ring 116 and the second baffle carrier ring 117. Alternatively, the second baffle carrier ring 117 can be at a different height than first baffle carrier ring 116 so that baffle inserts 120 are at an angle. A first indent 116A is formed on the top surface of the first baffle carrier ring 116 and a second indent 117A corresponding to the first indent 116A is formed on the top surface of the second baffle carrier ring 117. The baffle inserts 120 can be positioned between the first indent 116A and the second indent 117A.

Figure 6C:
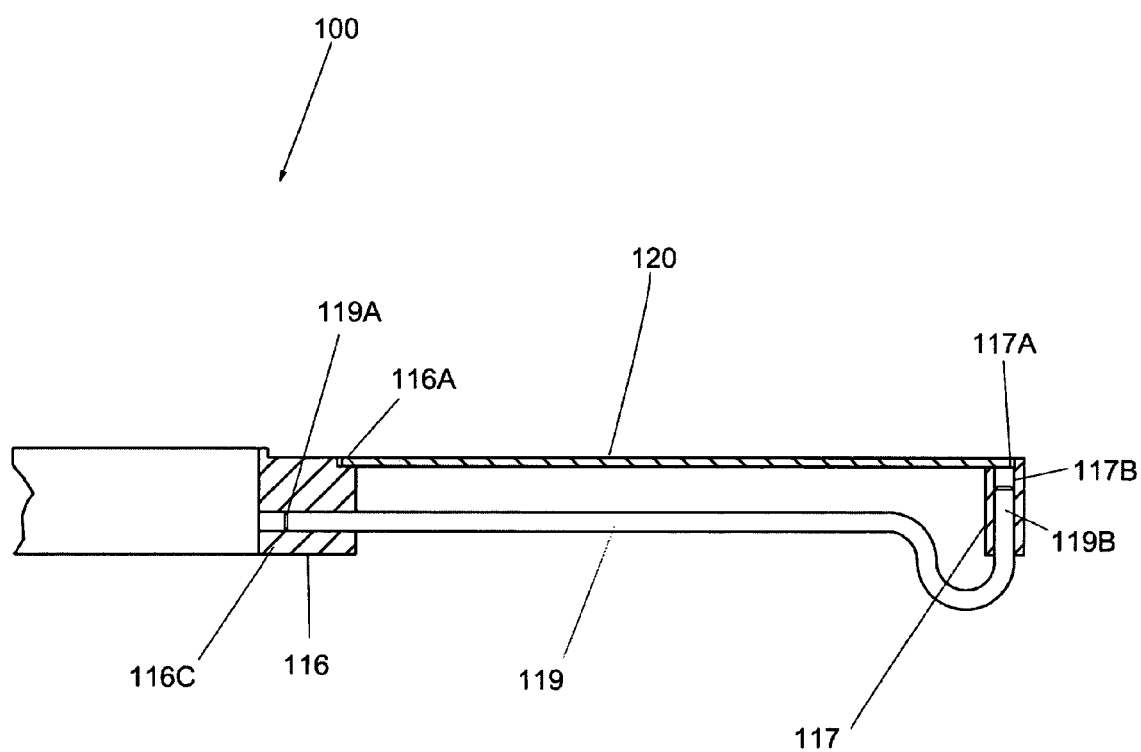
FIG. 6C shows a cross sectional view of a baffle assembly for a plasma processing system according to an alternative embodiment to FIG. 6B.

The baffle inserts 120 can be supported by any different structure. FIG. 6C illustrates support rods 119 having a U-shape portion on the end thereof. The first baffle carrier ring 116 comprises tunnel holes 116C extend horizontally. The first ends 119A of the support rods 119 are fitted in the tunnel holes 116C securely and the support rods are held horizontally or at any other angle. The second baffle carrier ring 117 comprises tube holes or slots 117B extending vertically. The second end 119B of the support rods 119 are formed in U-shape, and the tip of the second ends 119B are fitted in the tube holes or slots 117B. A first indent 116A is formed on the top surface of the first baffle carrier ring 116 and a second indent 117A corresponding to the first indent 116A is formed on the top surface of the second baffle carrier ring 117. The baffle inserts 120 can be positioned between the first indent 116A and the second indent 117A.

Figure 7:
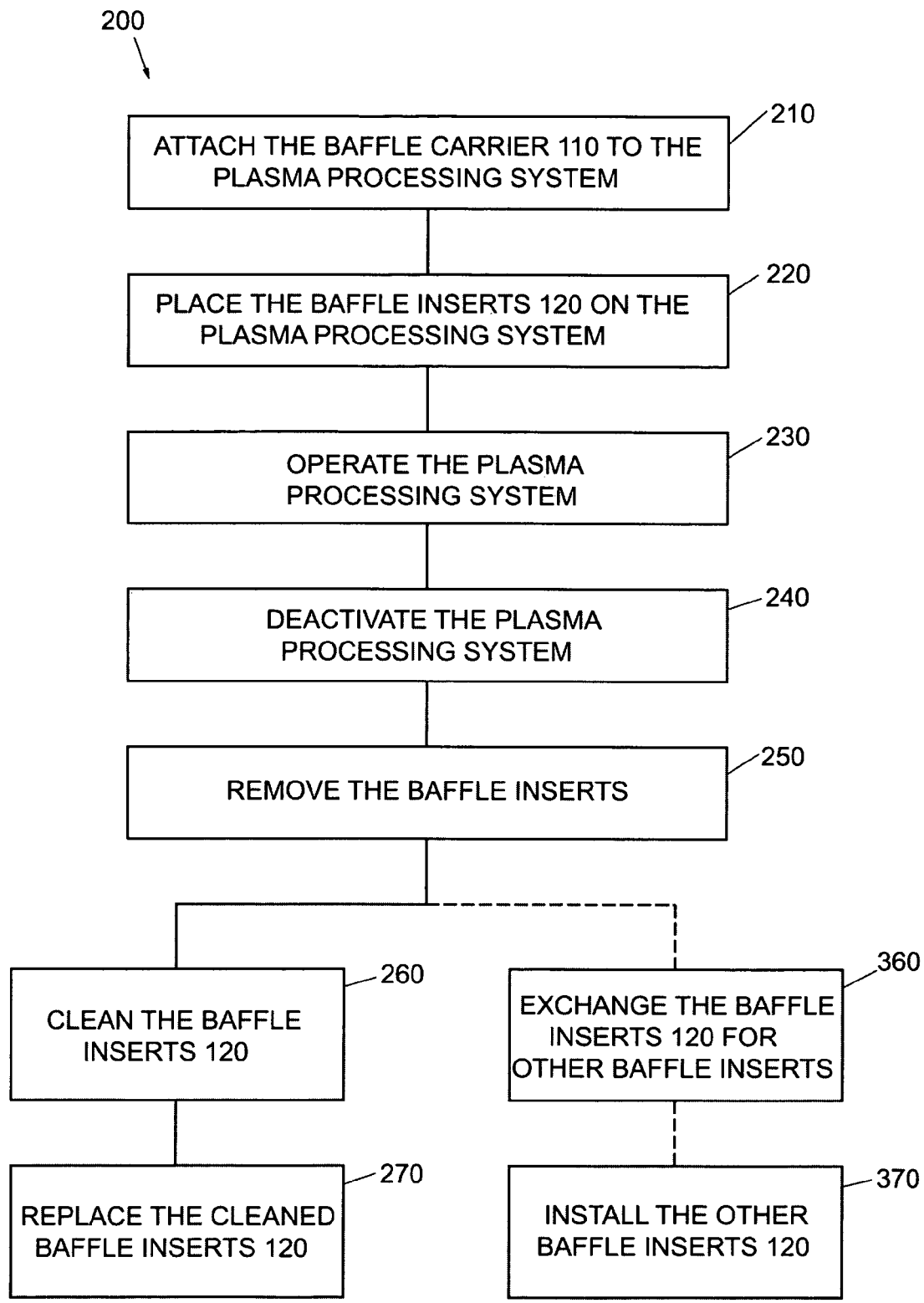
FIG. 7 presents a method of maintenance of a plasma processing system according to an embodiment of the present invention.

FIG. 7 presents the method of maintenance of a plasma processing system described in FIGS. 1-6C according to an embodiment of the present invention. Flow diagram 200 begins at 210 in which the baffle carrier 110 is attached to the plasma processing system 1. For example, the baffle carrier 110 can be attached to the chuck assembly 30 in the plasma processing system 1.

At 220, the baffle inserts 120 are installed on the baffle carrier 110. The baffle inserts 120 need not be secured to any part of the plasma processing system 1.

After the baffle assembly 100 comprising the baffle carrier 110 and baffle inserts 120 are installed to the plasma processing system 1, the plasma processing system 1 is operated at 230. After some period of use, the baffle assembly should be replaced or cleaned periodically.

At 240, when maintenance of the plasma processing system 1 is required, the plasma processing system 1 is deactivated. At 250, the baffle inserts 120 are removed from the plasma processing system 1. Since the baffle inserts 120 can merely lie on the baffle carrier 110, maintenance personnel do not need to disassemble other parts in the plasma processing system 1 and can easily remove the baffle inserts 120 from the plasma processing system 1.

At 260, the removed baffle inserts 120 are cleaned. If one or more of the baffle inserts 120 cannot be cleaned, they can be exchanged for new baffle insert(s) 120. Alternatively, all the removed baffle inserts 120 can be exchanged for new baffle inserts 120 (as shown at 360).

At 270, the cleaned baffle inserts 120 are replaced in the plasma processing system 1. Specifically, the cleaned baffle inserts 120 can be installed on the baffle carrier 110. In the case where one or more of the baffle inserts are exchanged to new baffle insert(s), the new baffle insert(s) are installed to the plasma processing system 1. Further, all of the baffle inserts are exchanged with other baffle insert(s), the other baffle insert(s) are installed to the plasma processing system 1 (as shown at 370). At 270 and 370, maintenance personnel may not need to secure the baffle inserts to any part of the plasma processing system 1.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A baffle assembly located in a plasma processing system having a chuck assembly for holding a substrate, comprising:
a baffle carrier formed into a ring surrounding the chuck assembly attached to the plasma processing system; and
at least two baffle inserts having a plurality of passages therethrough, the at least two baffle inserts being removably disposed on top of and supported by the baffle carrier,
wherein the at least two baffle inserts are not attached to the baffle carrier and lie on the baffle carrier.

2. The baffle assembly as recited in claim 1, wherein the at least two baffle inserts are not secured to any part of the plasma processing system.

3. The baffle assembly as recited in claim 1, wherein the at least two baffle inserts have the same shape.

4. The baffle assembly as recited in claim 1, wherein each of the at least two baffle inserts are adjacent to each other.

5. The baffle assembly as recited in claim 1, wherein the at least two baffle inserts have a disk shape.

6. The baffle assembly as recited in claim 1, wherein the plasma processing system includes a passageway for gas, and the at least two baffle inserts cover substantially the entire passageway.

7. The baffle assembly as recited in claim 1, wherein the baffle carrier comprises a baffle carrier ring attached to the chuck assembly and baffle carrier supports secured to the baffle carrier ring, and edges of the at least two baffle inserts are supported by the baffle carrier supports.

8. The baffle assembly as recited in claim 1, wherein the baffle inserts are substantially horizontal.

9. A plasma processing system comprising:
a processing chamber;
a chuck assembly disposed in said chamber for holding a substrate; and
a baffle assembly located in the processing chamber, wherein said baffle assembly comprises a baffle carrier formed into a ring surrounding the chuck assembly attached to the plasma processing system, and at least two baffle inserts having a plurality of passages therethrough, the at least two baffle inserts being removably disposed on top of and supported by the baffle carrier,
wherein the at least two baffle inserts are not attached to the baffle carrier and lie on the baffle carrier.

10. The plasma processing system as recited in claim 9, wherein the at least two baffle inserts are not secured to any part of the plasma processing system.

11. The plasma processing system as recited in claim 9, wherein the at least two baffle inserts have the same shape.

12. The plasma processing system as recited in claim 9, wherein each of the at least two baffle inserts are adjacent to each other.

13. The plasma processing system as recited in claim 9, wherein the at least two baffle inserts have a disk shape.

14. The plasma processing system as recited in claim 9, wherein the plasma processing system includes a passageway for gas, and the at least two baffle inserts cover substantially the entire passageway.

15. The plasma processing system as recited in claim 9, wherein the baffle carrier comprises a baffle carrier ring attached to the chuck assembly and baffle carrier supports secured to the baffle carrier ring, and edges of the at least two baffle inserts are supported by the baffle carrier supports.

16. The plasma processing system as recited in claim 9, wherein the baffle inserts are substantially horizontal.

* * * * *